United States Patent
Kuibira et al.

(10) Patent No.: US 7,837,798 B2
(45) Date of Patent: Nov. 23, 2010

(54) SEMICONDUCTOR PROCESSING APPARATUS WITH A HEAT RESISTANT HERMETICALLY SEALED SUBSTRATE SUPPORT

(75) Inventors: Akira Kuibira, Itami (JP); Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1290 days.

(21) Appl. No.: 10/480,166

(22) PCT Filed: Mar. 3, 2003

(86) PCT No.: PCT/JP03/02432

§ 371 (c)(1),
(2), (4) Date: Dec. 11, 2003

(87) PCT Pub. No.: WO03/074759

PCT Pub. Date: Sep. 12, 2003

(65) Prior Publication Data

US 2004/0168641 A1    Sep. 2, 2004

(30) Foreign Application Priority Data

Mar. 5, 2002    (JP)    ............................. 2002-058149

(51) Int. Cl.
*C23C 16/00*    (2006.01)
*C23F 1/00*    (2006.01)
*H01L 21/306*    (2006.01)

(52) U.S. Cl. .................. 118/728; 118/715; 118/729; 118/730; 156/345.51; 156/345.52; 156/345.53; 156/345.54; 156/345.55

(58) Field of Classification Search ................. 118/728, 118/729, 730, 715; 156/345.51, 345.52, 156/345.53, 345.54, 345.55

See application file for complete search history.

(56) References Cited

U.S. PATENT DOCUMENTS 5,269,822 A * 12/1993 Carolan et al. ................. 95/54

(Continued)

FOREIGN PATENT DOCUMENTS

EP    0 581 249 A1    7/1993

(Continued)

OTHER PUBLICATIONS

Merriam-Webster Online Dictionary, www.m-w.com/dictionary/embed.*

(Continued)

*Primary Examiner*—Parviz Hassanzadeh
*Assistant Examiner*—Rakesh Dhingra
(74) *Attorney, Agent, or Firm*—McDermott Will & Emery LLP

(57) ABSTRACT

An apparatus for manufacturing a semiconductor or liquid crystal is provided with a reaction chamber housing a ceramic holder with an embedded resistive heating element, and a cylindrical support member one end of which supports the ceramic holder and the other end of which side is fixed to the reaction chamber. One end of the cylindrical support member is hermetically bonded to the ceramic holder; and a partition plate and sealing material hermetically seal the other end of which side. Embodiments include partitioning the space within the cylindrical support member with the ceramic holder, and the partition plate and depressurizing to vacuum or to a reduced pressure atmosphere of an inert gas. Advantageously the cylindrical support member can easily be hermetically sealed, corrosion and oxidation of electrode terminals exposed on the rear surface of the ceramic holder prevented, the thermal uniformity and thermal efficiency of the holder improved, and the length of the cylindrical support member reduced, thereby reducing the size of the reaction chamber.

9 Claims, 1 Drawing Sheet

U.S. PATENT DOCUMENTS

| | | | |
|---|---|---|---|
| 5,462,603 A | 10/1995 | Murakami | |
| 5,478,429 A * | 12/1995 | Komino et al. | 156/345.44 |
| 5,688,331 A | 11/1997 | Aruga et al. | |
| 6,031,235 A | 2/2000 | Ishida et al. | |
| 6,126,753 A * | 10/2000 | Shinriki et al. | 118/715 |
| 6,756,235 B1 * | 6/2004 | Liu et al. | 438/3 |

FOREIGN PATENT DOCUMENTS

| | | |
|---|---|---|
| EP | 0 628 644 A2 | 5/1994 |
| GB | 2 279 366 A | 1/1995 |
| JP | 64-62381 | 3/1989 |
| JP | 05-267191 A | 10/1993 |
| JP | 6-50435 | 2/1994 |
| JP | 7-78766 | 3/1995 |
| JP | 7-153706 | 6/1995 |
| JP | 08-218172 A | 8/1996 |

OTHER PUBLICATIONS

Japanese Office Action for Corresponding Patent Application No. JP 2002-058149, dispatched Mar. 14, 2006.

* cited by examiner

SEMICONDUCTOR PROCESSING APPARATUS WITH A HEAT RESISTANT HERMETICALLY SEALED SUBSTRATE SUPPORT

TECHNICAL FIELD

This invention relates to an apparatus for manufacturing a semiconductor or liquid crystal, comprising means for holding and heating a material to be treated in a reaction chamber, and in particular relates to a CVD apparatus, a plasma CVD apparatus, an etching apparatus, a plasma etching apparatus, or other apparatus for manufacturing semiconductor or liquid crystal.

BACKGROUND ART

When etching and film formation are performed on a semiconductor wafer, normally single semiconductor-wafer production equipment, with excellent reaction control, is used. The semiconductor wafer is placed on the surface of a holder which is positioned within a reaction chamber, and may be left as is, or may be fixed in place mechanically, or may be chucked in place by electrostatic force by applying a voltage to an electrode embedded in the holder, or otherwise fixed to the holder.

The temperature of the semiconductor wafer held in this way is rigorously controlled, in order to maintain uniformity of the film formation rate and etch rate during CVD (chemical vapor deposition), plasma CVD or similar, or during etching, plasma etching or similar. In order to perform such rigorous temperature control, the holder is heated by a heating element incorporated in the holder, so that the semiconductor wafer is heated by heat transmitted from the surface thereof.

A holder having a heating element embedded therein is formed by, for example, embedding an Mo coil in a ceramic material. W or Mo electrodes connected to an Mo coil are provided on the opposite face (rear face) from the surface of the holder which holds the material to be treated; Ni or other lead wires are joined to the electrode ends and connected to an external power supply, so that heating is performed by supplying power to the Mo coil embedded in the ceramic holder.

Within the above reaction chamber, often a halogen gas or other corrosive gas is used as the reaction gas, and so the W or Mo electrodes exposed on the rear surface of the holder tend to be corroded. Hence by hermetically sealing a ceramic or metal cylindrical support member with excellent corrosion resistance to the rear surface of the holder, while also using an O-ring to seal the other end of the cylindrical support member to a portion of the reaction chamber, electrode terminals are protected so as not to be exposed to the reactive gas.

In conventional semiconductor or liquid crystal manufacturing apparatus, a method is employed in which an O-ring is used for hermetic sealing between the cylindrical support member housing the electrode terminals and the reaction chamber in order to protect the electrode terminals on the rear surface of the holder from the corrosive gas. The airtightness required is thought to be at least the equivalent of a He leak of less than $10^{-8}$ Pa·m$^3$/s with respect to a He leak. However, whereas O-ring sealing is reliable for such a convenient and inexpensive method, because the O-ring consists of rubber, the upper temperature limit is at most 200° C. even when a comparatively heat-resistant material is used.

Film formation, etching, heat treatment, and similar processes in the manufacturing of semiconductor or liquid crystal often involve the driving of reactions at temperatures of 200° C. and higher; in particular, in CVD and plasma CVD processes employed in film formation, high temperatures between 500 and 800° C. are often used. Consequently the vicinity of the O-ring must be forcibly cooled to maintain a temperature of less than 200° C., in order that the O-ring is not degraded due to heat conveyed through the cylindrical support member. As a result, 50% or more of the supplied heat is wasted without being used for the wafer heating for which it was intended.

Further, when a cylindrical support member is formed from ceramic material, if a large thermal gradient appears in the cylindrical support member the brittle ceramic material may crack, and so it has been necessary to use a long cylindrical support member of length approximately 300 mm, in order to mitigate the temperature gradient. The reaction chamber into which this long cylindrical support member must be placed cannot be reduced in size, and so an unnecessarily large structure becomes unavoidable.

Further, the hermetic sealing of cylindrical support member prevents the intrusion of halogen or other corrosive gas from within the reaction chamber; but often the cylindrical support member is used in an atmospheric environment. In such cases the electrode terminal vicinity is exposed to an oxidizing air atmosphere at a temperature of 500 to 800° C., so that the electrode terminals of W or Mo, with poor oxidation resistance, must be protected by applying an oxidation-resistant seal. However, it is not an easy task to apply such a seal deep within the long cylindrical support member, and so production yields are poor.

DISCLOSURE OF THE INVENTION

This invention was made in light of such circumstances of the prior art. It is an object of this invention to provide an apparatus for manufacturing a semiconductor or liquid crystal wherein operations for hermetic sealing of the cylindrical support member are easy, corrosion and oxidation of electrode terminals can be prevented, thermal uniformity in the holder can be enhanced as well as improvement in thermal efficiency, and the cylindrical support member can be shortened, so that the size of the reaction chamber can be reduced.

In order to achieve the above object, this invention provides an apparatus for manufacturing a semiconductor or liquid crystal, comprising a ceramic holder, which holds a material to be treated on the surface thereof within a reaction chamber supplied with a reactive gas and which generates heat using a resistive heating element embedded therein, and a cylindrical support member one end of which supports the ceramic holder at a surface other than a surface for holding the material to be treated and the other end of which is fixed to a portion of the reaction chamber, wherein one end of the cylindrical support member and the ceramic holder are hermetically bonded, whereas the other end side of the cylindrical support member is hermetically sealed within the cylindrical support member, and the space within the cylindrical support member partitioned by the ceramic holder and the aforementioned sealed portion on the other end side of the cylindrical support member is depressurized to vacuum or to a reduced-pressure atmosphere of an inert gas.

In the above-described semiconductor or liquid crystal manufacturing apparatus of this invention, it is preferable that the other end side of the above cylindrical support member be hermetically sealed only with a sealing material, or by disposing a partition plate within the cylindrical support member and hermetically sealing the gap between the plate and the other end of the cylindrical support member with a sealing material. Also, the sealed portion on the other end side of the above cylindrical support member is preferably closer to the other end of the cylindrical support member than the center in the length direction of the cylindrical support member, and more preferably the sealed portion is in proximity to the other end of the cylindrical support member.

In the above semiconductor or liquid crystal manufacturing apparatus of this invention, it is preferable that the sealing material used for hermetic sealing on the other end side of the above cylindrical support member have a heat resistance of 200° C. or higher. It is preferable that the above sealing material be glass or glass ceramic, or that the above sealing material be a heat-resistant resin.

In the above semiconductor or liquid crystal manufacturing apparatus of this invention, it is preferable that the above ceramic holder and cylindrical support member be formed from at least one ceramic material selected from the group consisting of aluminum nitride, silicon nitride, silicon carbide, and aluminum oxide. It is preferable that the above resistive heating element be formed from at least one metal material selected from the group consisting of W, Mo, Pt, Au, Pd, Ag, Ni, and Cr.

BEST MODE FOR CARRYING OUT THE INVENTION

Figure 1:
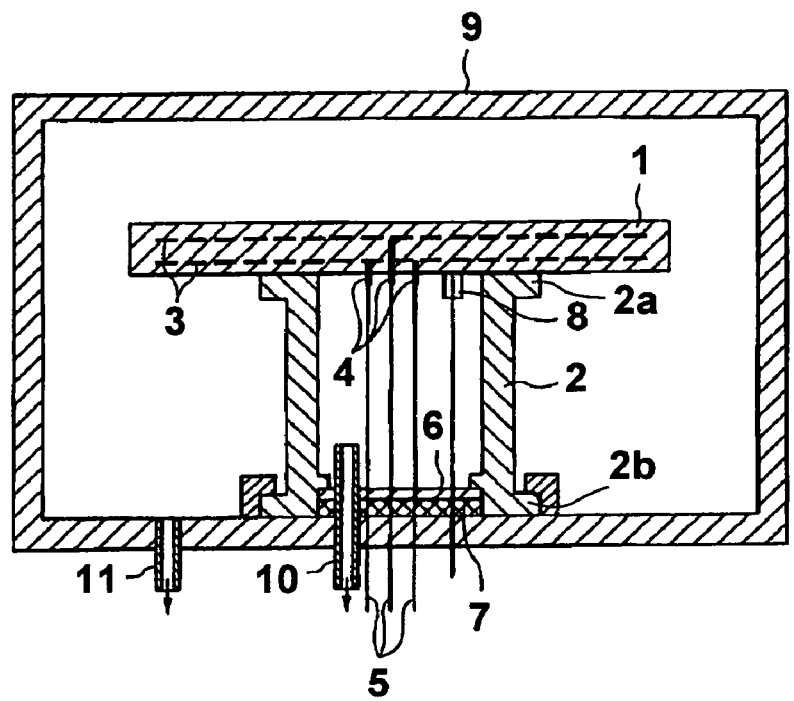
FIG. 1 is a schematic cross-sectional view showing one concrete example of the semiconductor or liquid crystal manufacturing apparatus of this invention.

In the semiconductor or liquid crystal manufacturing apparatus of this invention, a plate-shaped ceramic holder in which is embedded a resistive heating element and a cylindrical support member one end of which supports the ceramic holder at a surface other than the surface for holding the material to be treated are hermetically bonded, and in addition the other end side of the cylindrical support member is hermetically sealed within the cylindrical support member. Within the cylindrical support member, a space partitioned hermetically by the ceramic holder and the sealed portion on the other end side of the cylindrical support member is formed, and by evacuating or creating a reduced-pressure atmosphere of an inert gas in this space, the electrode terminals can be protected from corrosion and oxidation without providing a corrosion-resistant or oxidation-resistant seal.

Further, by maintaining the partitioned space within the cylindrical support member in a state of vacuum or reduced-pressure atmosphere of an inert gas as described above, the rate at which the heat of the ceramic holder escapes into the interior atmosphere via the cylindrical support member can be reduced compared with the case of air or inert gas at atmospheric pressure. And, because an O-ring is not used for hermetic sealing of the other end of the cylindrical support member, the cooling of this portion can be eliminated or reduced. By this means, the thermal uniformity in the ceramic holder can be improved, and the thermal efficiency can be greatly increased.

Although the hermetic seal on the other end side of the cylindrical support member may be effected by sealing the interior of the cylindrical support member using only a sealing material, the hermetic seal is preferably effected by arranging a ceramic or metal partition plate in the interior of the cylindrical support member and sealing the gap between the above other end and the partition plate with a sealing material, from the standpoint of reliability, operability, cost, and other factors.

It is preferable that the position of the sealed portion on the other end side, which seals the other end side of the cylindrical support member, be closer to the other end (toward the reaction chamber) of the cylindrical support member than the center in the length direction. By distancing the sealed portion on the other end side from the ceramic holder as much as possible, and performing sealing at a position which will be at a lower temperature, the degree of freedom in choice of sealing material is increased and degradation of the sealing material is suppressed; in addition, sealing operations can be facilitated. In particular, placing the above-described sealed portion on the other end side in proximity to the other end of the cylindrical support member causes the effect in preventing degradation of the sealing material and the sealing operation efficiency to be maximized, and so is most desirable.

As the sealing material used in the hermetic seal on the other end of the cylindrical support member, a sealing material with a heat resistance of 200° C. or higher is used, without using an O-ring with a heat resistance of less than 200° C. As the sealing material with a heat resistance of 200° C. or higher, it is preferable that glass or glass ceramic, or an imide resin, an epoxy resin, or other heat-resistant resin be used.

A sealing glass has excellent heat and oxidation resistance, and can be used without cooling the vicinity of the other end of the cylindrical support member. If a heat-resistant resin is used, the sealing operation within the cylindrical support member can be easily performed and sealing at normal temperatures is possible, so that sealing costs can be greatly reduced and yields can be improved considerably.

It is preferable that a ceramic material with good corrosion resistance with respect to halogens and similar, and with high heat resistance and insulating properties be used in the ceramic holder; specifically, the use of aluminum nitride (AlN), silicon nitride ($Si_3N_4$), silicon carbide (SiC), or aluminum oxide ($Al_2O_3$) is preferable.

As the resistive heating element embedded in the ceramic holder, it is preferable that metals selected from the group consisting of W, Mo, Pt, Au, Pd, Ag, Ni, and Cr be used; for example, in addition to metallizing W, Mo, Pt—Au, Ag—Pd, or Ni—Cr, these can also be used in the form of foil, mesh, or coil, embedded in the ceramic holder.

Ceramic and metal materials with good corrosion resistance are used in the cylindrical support member; but in consideration of the fact that a hermetic junction with high heat resistance is to be formed at one end with the ceramic holder, it is most preferable that a ceramic material with matching thermal expansion coefficient, and in particular material which is the same as in the ceramic holder, be used.

EXAMPLE 1

To aluminum nitride (AlN) powder was added, as a sintering agent, 0.5 weight percent yttria ($Y_2O_3$) on an aluminum nitride powder weight basis, and after further adding an organic binder, dispersing and mixing, spray-drying was used in granulation. The granulated powder thus obtained was formed by uniaxial pressing to produce two compacts of shape A, which provided dimensions of 350 mm in outer diameter and 5 mm in thickness after sintering. The same granulated powder was used in CIP (cold isostatic pressing) to form a single compact of shape B, which provided a substantially cylindrical sintered body with an outer diameter of 100 mm, an inner diameter of 90 mm, and a length of 100 mm after sintering.

After forming grooves of width 4.5 mm and depth 2.5 mm on the surface of the compacts with shape A, degreasing in a nitrogen flow at 800° C. was then performed. An Mo coil was laid into the grooves, and the two compacts were laminated and subjected to hot press sintering in a nitrogen flow at 1850° C. for four hours under a pressure of 9.8 MPa (100 kgf/cm$^2$). The surface of the sintered body thus obtained was polished with diamond abrasives, the tips of the Mo coil were exposed on the rear surface, W electrode terminals were provided, and the resulting body was used as an AlN ceramic holder. On the other hand, the compact with shape B was degreased in a nitrogen flow at 800° C., then sintered in a nitrogen flow at 1850° C. for four hours; the surface of the sintered part thus obtained was polished with diamond abrasives, for use as an AlN cylindrical support member.

As shown in FIG. 1, one end 2a of the cylindrical support member 2 was brought into contact with the rear surface of the above ceramic holder 1, and was set such that the electrode terminals 4 of the resistive heating element 3 comprising an Mo coil were inside; hot press joining was then performed at 1800° C. for one hour, under a pressure of 9.8 MPa (100 kgf/cm$^2$). Then Ni lead wires 5 were connected to the electrode terminals 4 on the rear surface of the ceramic holder 1. An AlN partition plate 6, having holes through which to pass the lead wires 5 and an exhaust tube 10, was set within the cylindrical support member 2 close to the other end 2b, and after passing the lead wires 5 and exhaust tube 10 through the holes, an imide resin sealing material 7 was applied to the entire face on the other side of the partition plate 6, to hermetically seal the gaps between the partition plate 6 and the cylindrical support member 2, lead wires 5, and exhaust tube 10.

This cylindrical support member 2 (onto one end 2a of which was hermetically bonded the ceramic holder 1, and the interior of the other end 2b of which was hermetically sealed by the partition plate 6 and sealing material 7) was placed within the reaction chamber 9, and the other end 2b of the cylindrical support member 2 was fixed with a clamp to the bottom of the reaction chamber 9; hermetic sealing with an O-ring was not performed. There was almost no gap between the other-end face (the bottom-side face) of the sealing material 7 which sealed the interior of the cylindrical support member 2 and the bottom of the reaction chamber 9. Then, nitrogen gas was introduced while evacuating the interior of the cylindrical support member 2 via the exhaust tube 10 passing through the partition plate 6 and sealing material 7. In the figure, 8 is a thermocouple for measurement of temperatures, and 11 is an exhaust tube of the reaction chamber.

The nitrogen gas atmosphere within the cylindrical support member 2 was maintained at a pressure of 13.3 kPa (100 torr), and the ceramic holder 1 was heated to 500° C., At this time the thermal uniformity in the ceramic holder 1 was ±0.5%, and thermal efficiency was 80%. The thermal uniformity indicates, as percentages of the respective temperature differences between the highest temperature and the mean temperature and between the lowest temperature and the mean temperature, with respect to the mean temperature, for the temperature distribution over the ceramic holder. Thermal uniformity is similarly defined in the following examples and comparative examples.

EXAMPLE 2

To silicon nitride ($Si_3N_4$) powder was added, as a sintering agent, 3 weight percent yttria ($Y_2O_3$) and 2 weight percent aluminum oxide ($Al_2O_3$) on a silicon nitride powder weight basis, and after further adding an organic binder, dispersing and mixing, spray-drying was used in granulation. The granulated powder thus obtained was used to fabricate a ceramic holder and cylindrical support member by the same method as in Example 1 above, except that the sintering conditions were five hours at 1750° C., and the joining conditions were one hour at 1730° C.

These $Si_3N_4$ ceramic holder and cylindrical support member were used to fabricate an apparatus as in Example 1 above, and evaluations were performed using the same method. It was found that the thermal uniformity of the ceramic holder was ±0.8%, and the thermal efficiency was 65%.

EXAMPLE 3

To silicon carbide (SiC) powder was added, as a sintering agent, 2 weight percent boron carbide ($B_4C$) and 1 weight percent carbon (C) on a silicon carbide powder weight basis, and after further adding an organic binder, dispersing and mixing, spray-drying was used in granulation. The granulated powder thus obtained was used to fabricate a ceramic holder and cylindrical support member by the same method as in Example 1 above, except that the sintering conditions were five hours at 1950° C., and the joining conditions were two hours at 1900° C.

These SiC ceramic holder and cylindrical support member were used to fabricate an apparatus as in Example 1 above, and evaluations were performed using the same method. It was found that the thermal uniformity of the ceramic holder was ±0.7%, and the thermal efficiency was 70%.

EXAMPLE 4

To aluminum oxide ($Al_2O_3$) powder was added, as a sintering agent, 2 weight percent magnesia (MgO) on an aluminum oxide powder weight basis, and after further adding an organic binder, dispersing and mixing, spray-drying was used in granulation. The granulated powder thus obtained was used to fabricate a ceramic holder and cylindrical support member by the same method as in Example 1 above, except that the sintering conditions were five hours at 1600° C., and the joining conditions were one hour at 1550° C.

This $Al_2O_3$ ceramic holder and cylindrical support member were used to fabricate a device as in Example 1 above, and evaluations were performed using the same method. It was found that the thermal uniformity of the ceramic holder was ±0.95%, and the thermal efficiency was 55%.

EXAMPLE 5

The same method as in Example 1 above was used to fabricate compacts of AlN in shape A and shape B. Each of the compacts was degreased in a nitrogen flow at 800° C., then sintered for four hours at 1850° C., followed by surface polishing using diamond abrasives.

A circuit was printed using a W paste, prepared by adding a sintering agent and an ethyl cellulose binder to a W powder, on the surface of one plate-shaped sintered body obtained from one of the compacts with shape A, and after degreasing in a nitrogen flow at 900° C., firing was performed in a nitrogen flow at 1830° C. A bonding agent was applied to the remaining one plate-shaped sintered body, and after degreasing in a nitrogen flow at 900° C., this was superposed onto the plate-shaped sintered body having the above circuit thereon.

A bonding agent was also applied to one end face of the cylindrical sintered body obtained from the compact with shape B, and this was placed against the rear surface of the above-described superposed plate-shaped sintered bodies; after degreasing in a nitrogen flow at 900° C., sintering was performed for two hours at 1800° C. to join the bodies. W electrode terminals were connected to the W inner circuit at the rear face of the ceramic holder thus obtained, and Ni lead wires were connected to the W electrode terminals.

Then, an AlN partition plate, with holes opened to pass the lead wires, was set in the inside and near the other end of the cylindrical support member, and an epoxy resin sealing material was used to hermetically seal the entire surface of the partition plate facing the other end side. This cylindrical support member was placed inside the reaction chamber, and the other end of the cylindrical support member was fixed by clamping to the bottom of the reaction chamber, similarly to the above-described Example 1.

As in the above Example 1, the pressure of the nitrogen gas atmosphere within the cylindrical support member was maintained at 13.3 kPa (100 torr), and the ceramic holder was heated to 500° C. At this time, the thermal uniformity of the ceramic holder was ±45%, and the thermal efficiency was 80%.

EXAMPLE 6

An AlN ceramic holder and cylindrical support member were fabricated by the same method as in the above Example 5, except that a paste prepared by kneading Pt—Au, a sintering agent and an ethyl cellulose binder was used as the circuit paste, the sintering conditions were 900° C. for two hours, and a bonding glass was used as the bonding agent between the ceramic holder and the cylindrical support member to perform bonding for one hour at 800° C.

An AlN partition plate having holes to pass lead wires therethrough was set in the inside and near the other end of the cylindrical support member, and the entire face of the partition plate facing the other end side was hermetically sealed with an epoxy resin sealing material. The above ceramic holder and cylindrical support member were placed in the reaction chamber, and the other end of the cylindrical support member was fixed by clamping to the bottom of the reaction chamber, similarly to the above-described Example 1.

Similarly to the above Example 1, the nitrogen gas atmosphere within the cylindrical support member was maintained at a pressure of 13.3 kPa (100 torr), and the ceramic holder was heated to 500° C. At this time, the thermal uniformity of the ceramic holder was ±0.45%, and the thermal efficiency was 80%.

EXAMPLE 7

An AlN ceramic holder and cylindrical support member were fabricated by same method as described in the above Example 6, except that a paste prepared by kneading Ag—Pd, a sintering agent and an ethyl cellulose binder was used as the circuit paste, and the sintering conditions were two hours at 850° C.

An AlN partition plate having holes to pass lead wires therethrough was set in the inside and near the other end of the cylindrical support member, and the entire face of the partition plate facing the other end side was hermetically sealed with an epoxy resin sealing material. The ceramic holder and cylindrical support member were placed in the reaction chamber, and the other end of the cylindrical support member was fixed by clamping to the bottom of the reaction chamber, similarly to the above-described Example 1.

Similarly to the above Example 1, the nitrogen gas atmosphere within the cylindrical support member was maintained at a pressure of 13.3 kPa (100 torr), and the ceramic holder was heated to 500° C. At this time, the thermal uniformity of the ceramic holder was ±45%, and the thermal efficiency was 80%.

EXAMPLE 8

An AlN ceramic holder and cylindrical support member were fabricated by the same method as described in the above Example 6, except that a paste prepared by kneading Ni—Cr, a sintering agent and an ethyl cellulose binder was used as the circuit paste, and the sintering conditions were two hours at 750° C.

An AlN partition plate having holes to pass lead wires therethrough was set in the inside and near the other end of the cylindrical support member, and the entire face of the partition plate facing the other end side was hermetically sealed with an epoxy resin sealing material. The ceramic holder and cylindrical support member were placed in the reaction chamber, and the other end of the cylindrical support member was fixed by clamping to the bottom of the reaction chamber, similarly to the above-described Example 1.

Similarly to the above Example 1, the nitrogen gas atmosphere within the cylindrical support member was maintained at a pressure of 13.3 kPa (100 torr), and the ceramic holder was heated to 500° C. At this time, the thermal uniformity of the ceramic holder was ±45%, and the thermal efficiency was 80%.

EXAMPLE 9

An AlN ceramic holder and cylindrical support member were fabricated by the same method as in the above Example 1, except that hermetic sealing on the other end side of the cylindrical support member was performed at 750° C. for one hour, using only a sealing glass without a partition plate. These AlN ceramic holder and cylindrical support member were placed within the reaction chamber in the same manner as in the above Example 1.

Similarly to the above Example 1, the nitrogen gas atmosphere within the cylindrical support member was maintained at a pressure of 13.3 kPa (100 torr), and the ceramic holder was heated to 500° C. At this time, the thermal uniformity of the ceramic holder was ±45%, and the thermal efficiency was 80%.

EXAMPLE 10

Figure 2:
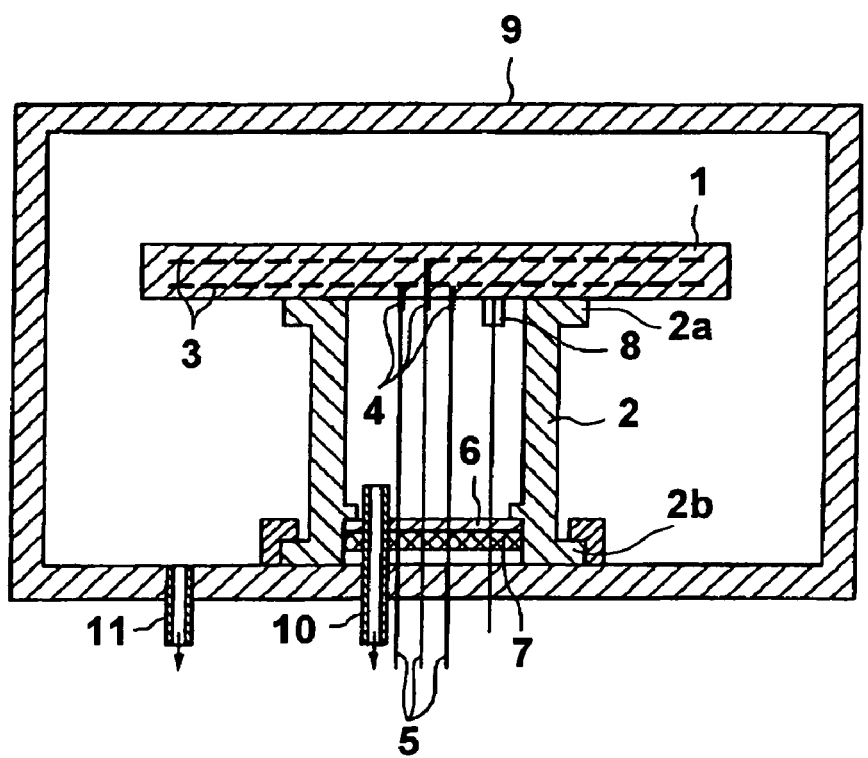
FIG. 2 is a schematic cross-sectional view showing another concrete example of the semiconductor or liquid crystal manufacturing apparatus of this invention.

An AlN ceramic holder 1 and cylindrical support member 2 were fabricated by the same method as in the above Example 1, except that hermetic sealing on the other end 2b side of the cylindrical support member was performed by positioning the AlN partition plate 6 at a position 25 mm distant from the other end 2b within the cylindrical support member 2 and hermetically sealing the gap with an imide resin sealing material 7, as shown in FIG. 2. The thus obtained AlN ceramic holder and cylindrical support member were placed within the reaction chamber 9 in the same manner as in the above Example 1.

Similarly to the above Example 1, the nitrogen gas atmosphere within the cylindrical support member was maintained at a pressure of 13.3 kPa (100 torr), and the ceramic holder was heated to 500° C. At this time, the thermal uniformity of the ceramic holder was ±45%, and the thermal efficiency was 80%.

COMPARATIVE EXAMPLE 1

An AlN ceramic holder and cylindrical support member were fabricated by the same method as described in the above Example 1, except that the W electrode terminals was sealed with glass whereas the space between the other end of the cylindrical support member and the reaction chamber was sealed with an O-ring and the vicinity of such a sealed portion was forcibly water-cooled to less than 200° C. The thus obtained AlN ceramic holder and cylindrical support member were installed in the reaction chamber similarly to the above Example 1.

The interior of the cylindrical support member was filled with air, and the ceramic holder was heated to 500° C. At this time the thermal uniformity of the ceramic holder was ±1.8%, and the thermal efficiency was 30%. During heating and measurements, thermal stress caused cracks in the cylindrical support member, and so measurements were halted prematurely.

COMPARATIVE EXAMPLE 2

Except for a cylindrical support member length of 300 mm, the same method as in the above Comparative Example 1 was carried out to fabricate an AlN ceramic holder and cylindrical support member, and these were installed in the reaction chamber similarly to the above Example 1.

The interior of the cylindrical support member was filled with air, and the ceramic holder was heated to 500° C. At this time the thermal uniformity of the ceramic holder was ±1.5%, and the thermal efficiency was 40%. During measurements, cracks did not occur in the cylindrical support member.

INDUSTRIAL APPLICABILITY

According to this invention, operations to hermetically seal the cylindrical support member are facilitated, corrosion and oxidation of electrode terminals can be prevented, cooling can be reduced or eliminated through the elimination of an O-ring in the hermetic seal, and the thermal uniformity and thermal efficiency of the ceramic holder can be improved. Moreover, the cylindrical support member length can be shortened, and consequently the size of the reaction chamber can be reduced.

The invention claimed is:

1. An apparatus for manufacturing a semiconductor or liquid crystal, the apparatus comprising:
   a reaction chamber to which is supplied a reactive gas;
   a ceramic holder, within the reaction chamber, which holds a material to be treated on a surface thereof and which is heated by a resistive heating element embedded therein; and
   a cylindrical support member, within the reaction chamber, comprising a first end which supports the ceramic holder at a surface other than a surface for holding the material to be treated, and a second end which is fixed to a portion of the reaction chamber, wherein
   the first end of the cylindrical support member and the ceramic holder are hermetically bonded,
   the second end side of the cylindrical support member is hermetically sealed by a sealing material disposed within the cylindrical support member, and
   the space within the cylindrical support member defined by the ceramic holder and the sealed portion on the second end side depressurized either to vacuum or to a reduced-pressure atmosphere of an inert gas.

2. The apparatus according to claim 1, wherein the second end side of the cylindrical support member is hermetically sealed using only a sealing material, or alternatively by disposing a partition plate within the cylindrical support member and hermetically sealing a gap between the plate and the second end with a sealing material.

3. The apparatus according to claim 1, wherein the sealed portion on the second end side of the cylindrical support member is closer to the second end of the cylindrical support member than the center in the length direction of the cylindrical support member.

4. The apparatus according to claim 3, wherein the sealed portion on the second end side of the cylindrical support member is in the vicinity of the second end of the cylindrical support member.

5. The apparatus according to claim 1, wherein the sealing material used in the hermetic seal on the second end of the cylindrical support member has a heat resistance of 200° C. or higher.

6. The apparatus according to claim 5, wherein the sealing material is glass or glass ceramic.

7. The apparatus according to claim 5, wherein the sealing material is a heat-resistant resin.

8. The apparatus according to claim 1, wherein the ceramic holder and cylindrical support member are formed from at least one ceramic material selected from the group consisting of aluminum nitride, silicon nitride, silicon carbide, and aluminum oxide.

9. The apparatus according to claim 1, wherein the resistive heating element is formed from at least one metal material selected from the group consisting of W, Mo, Pt, Au, Pd, Ag, Ni, and Cr.

* * * * *